(12) United States Patent
Marohl et al.

(10) Patent No.: US 7,094,139 B2
(45) Date of Patent: Aug. 22, 2006

(54) RETAINING RING WITH FLANGE FOR CHEMICAL MECHANICAL POLISHING

(75) Inventors: Dan A. Marohl, San Jose, CA (US); Ming-Kuei Tseng, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 211 days.

(21) Appl. No.: 10/659,047

(22) Filed: Sep. 8, 2003

(65) Prior Publication Data

US 2004/0152403 A1 Aug. 5, 2004

Related U.S. Application Data

(60) Provisional application No. 60/445,352, filed on Feb. 5, 2003.

(51) Int. Cl.
*B24B 21/18* (2006.01)

(52) U.S. Cl. .................... 451/442; 451/288; 451/398

(58) Field of Classification Search ............... 451/36, 451/41, 59, 63, 285, 286, 287, 288, 289, 451/290, 397, 398, 442
See application file for complete search history.

(56) References Cited

U.S. PATENT DOCUMENTS

| | | | |
|---|---|---|---|
| 5,205,082 A | 4/1993 | Shendon et al. | |
| 5,423,558 A | 6/1995 | Koeth et al. | |
| 5,584,751 A | 12/1996 | Kobayashi et al. | |
| 5,605,488 A | 2/1997 | Ohashi et al. | |
| 5,635,083 A | 6/1997 | Breivogel et al. | |
| 5,643,053 A | 7/1997 | Shendon | |
| 5,643,061 A * | 7/1997 | Jackson et al. | 451/289 |
| 5,645,474 A | 7/1997 | Kubo et al. | |
| 5,647,789 A | 7/1997 | Kitta et al. | |
| 5,695,392 A | 12/1997 | Kim | |
| 5,759,918 A | 6/1998 | Hoshizaki et al. | |
| 5,851,140 A | 12/1998 | Barns et al. | |
| 6,089,961 A * | 7/2000 | Cesna et al. | 451/285 |
| 6,143,127 A * | 11/2000 | Perlov et al. | 156/345.14 |
| 6,224,472 B1 * | 5/2001 | Lai et al. | 451/398 |
| 6,277,008 B1 | 8/2001 | Masuta et al. | |
| 6,354,927 B1 * | 3/2002 | Natalicio | 451/287 |
| 6,527,624 B1 * | 3/2003 | Tolles et al. | 451/41 |
| 6,736,713 B1 * | 5/2004 | Lougher et al. | 451/398 |
| 2002/0173256 A1 | 11/2002 | Suwabe | |
| 2004/0065412 A1 | 4/2004 | Ensinger | |
| 2004/0067723 A1 | 4/2004 | Ensinger | |

FOREIGN PATENT DOCUMENTS

| | | |
|---|---|---|
| EP | 0 747 167 A2 | 12/1996 |
| EP | 0 776 730 A1 | 6/1997 |
| EP | 0 790 100 A1 | 8/1997 |
| EP | 0 841 123 A1 | 5/1998 |
| EP | 0 988 931 A2 | 3/2000 |

(Continued)

OTHER PUBLICATIONS

"High-Tech Resins Boost Chip Production", Machine Design, Nov. 7, 1996, pp. 52+. ["Machine Design"].

(Continued)

*Primary Examiner*—Timothy V. Eley
(74) *Attorney, Agent, or Firm*—Fish & Richardson P.C.

(57) ABSTRACT

A retaining ring has a generally annular body with a top surface, a bottom surface, an inner diameter surface, and an outer diameter surface. The outer diameter surface includes an outwardly projecting flange having a lower surface, and the bottom surface includes a plurality of channels.

11 Claims, 4 Drawing Sheets

FOREIGN PATENT DOCUMENTS

| | | |
|---|---|---|
| EP | 1038636 A2 | 9/2000 |
| GB | 2 307 342 A | 5/1997 |
| GB | 2 336 121 A | 10/1999 |
| JP | 12-225556 | 8/2000 |
| KR | 195222 | 2/1999 |
| KR | 2000-18619 | 4/2000 |
| KR | 2002-84818 | 11/2002 |

OTHER PUBLICATIONS

"Advanced Engineering Plastics for Semiconductor Industry", DSM Engineering (Polymer Corporation), 1996. ["DSM"].

"Advanced Engineering Plastics for the Semiconductor Industry", DSM Engineering (Polymer Corporation), 1997. ["DSM"].

* cited by examiner

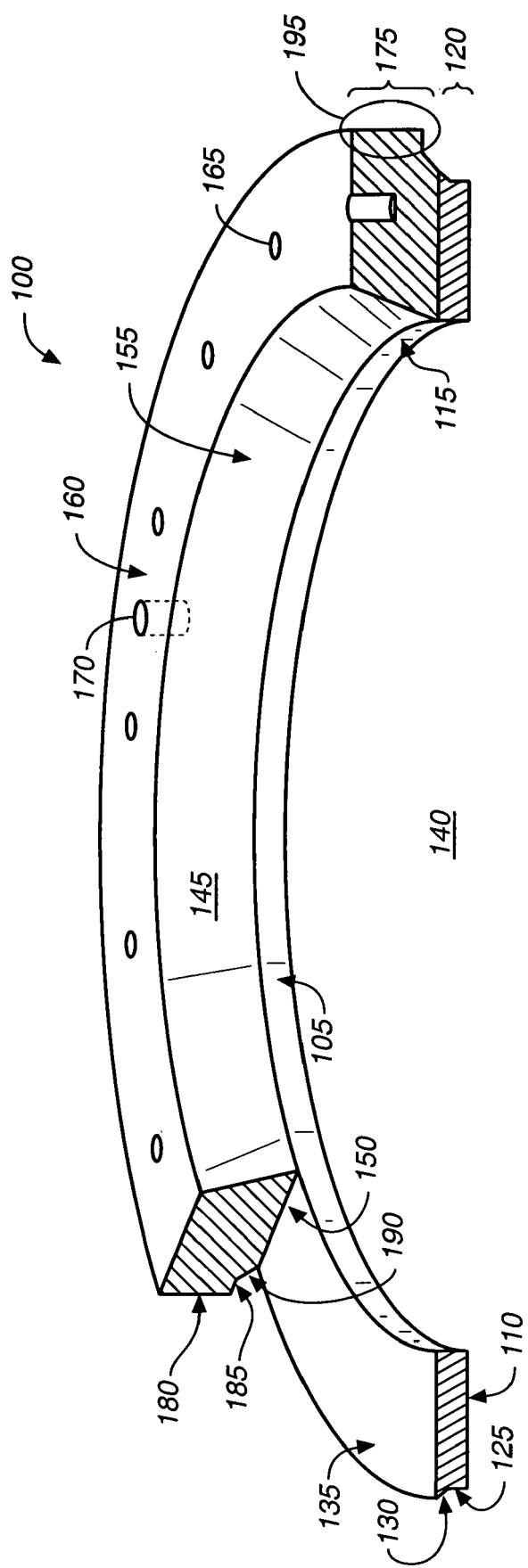
FIG._1

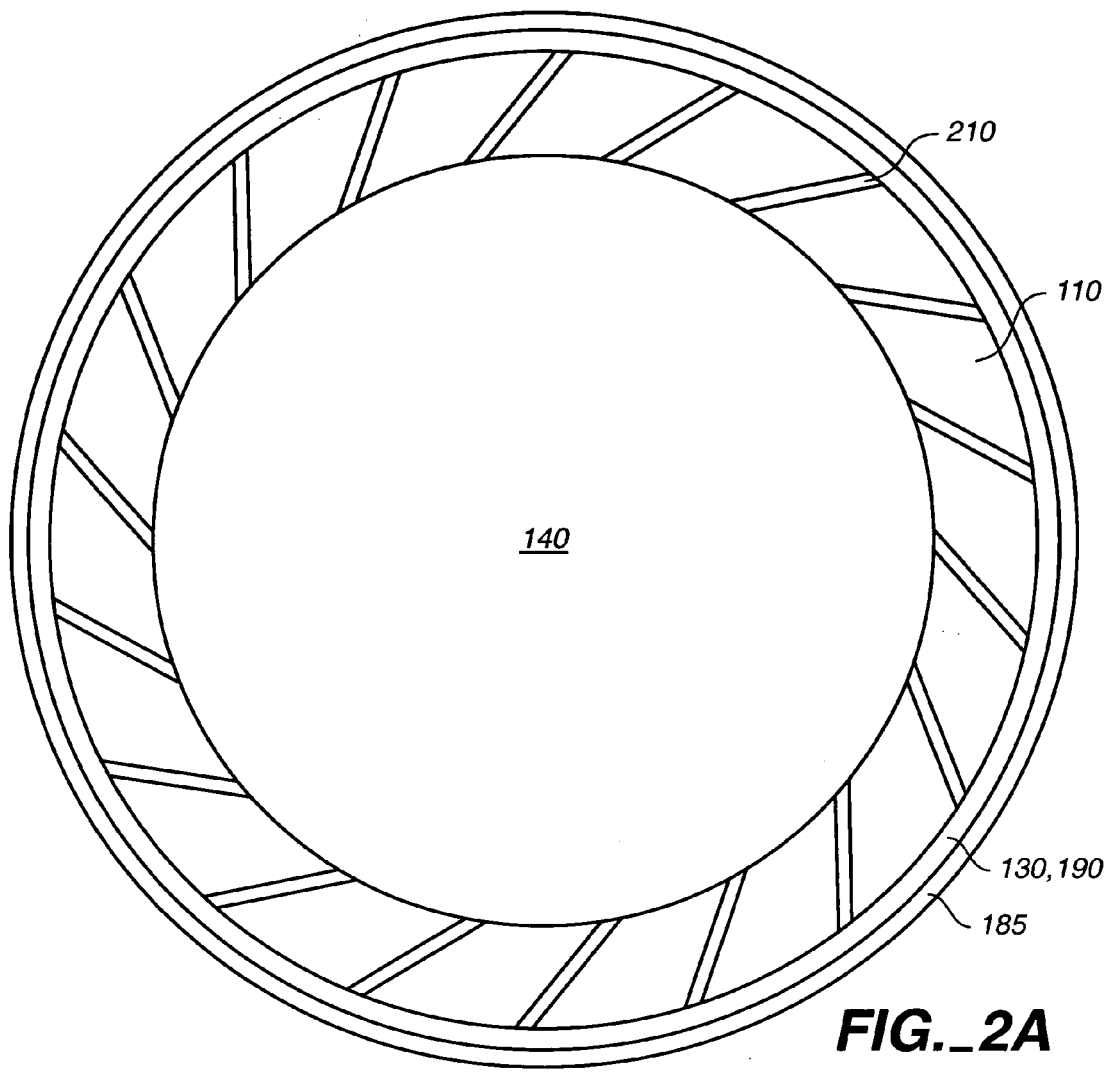
FIG._2A
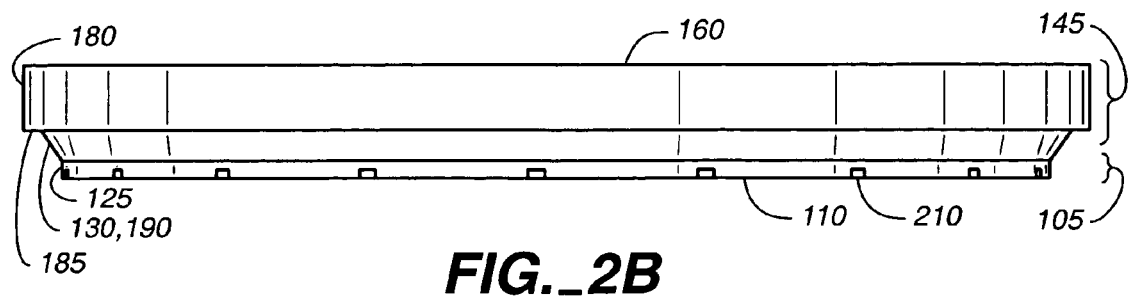
FIG._2B

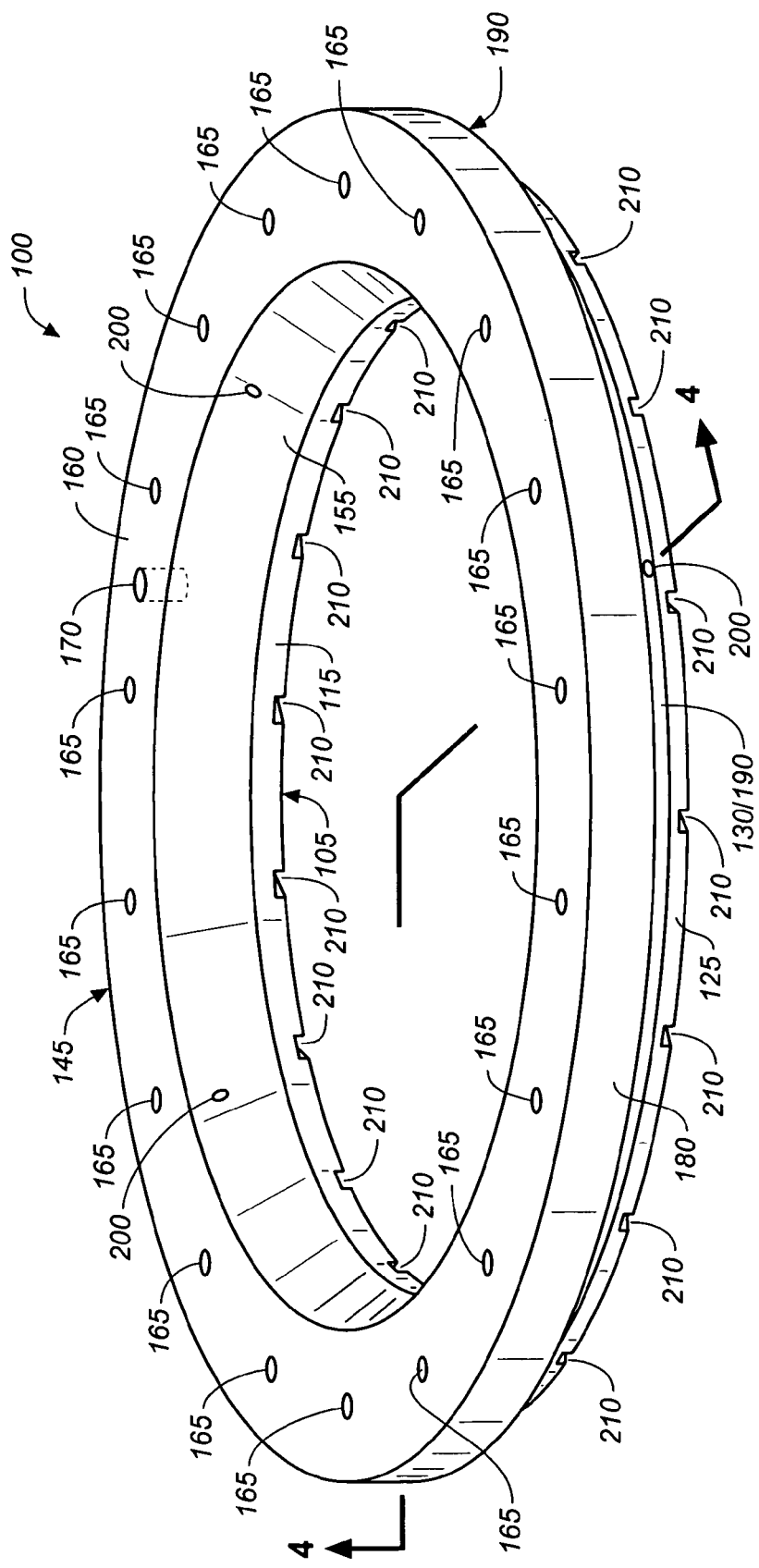
FIG._3

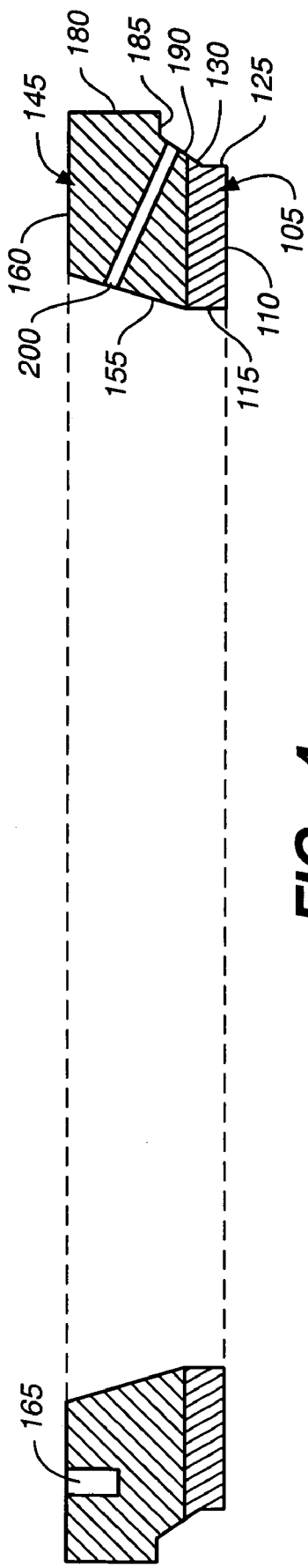
FIG._4

RETAINING RING WITH FLANGE FOR CHEMICAL MECHANICAL POLISHING

CROSS-REFERENCE TO RELATED APPLICATIONS

This application claims the benefit of U.S. Provisional Application No. 60/445,352, filed on Feb. 5, 2003, which is incorporated by reference herein.

BACKGROUND

The present invention relates generally to chemical mechanical polishing of substrates, and more particularly to a retaining ring for use in chemical mechanical polishing.

An integrated circuit is typically formed on a substrate by the sequential deposition of conductive, semiconductive or insulative layers on a silicon substrate. One fabrication step involves depositing a filler layer over a non-planar surface, and planarizing the filler layer until the non-planar surface is exposed. For example, a conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization is needed to planarize the substrate surface for photolithography.

Chemical mechanical polishing (CMP) is one accepted method of planarization. This planarization method typically requires that the substrate be mounted on a carrier or polishing head of a CMP apparatus. The exposed surface of the substrate is placed against a rotating polishing disk pad or belt pad. The polishing pad can be either a "standard" pad or a fixed-abrasive pad. A standard pad has a durable roughened surface, whereas a fixed-abrasive pad has abrasive particles held in a containment media. The carrier head provides a controllable load on the substrate to push it against the polishing pad. A polishing slurry, including at least one chemically-reactive agent, and abrasive particles if a standard pad is used, is supplied to the surface of the polishing pad.

SUMMARY

In one aspect, the invention is directed to a retaining ring that is a generally annular body having a top surface, a bottom surface, an inner diameter surface, and an outer diameter surface. The outer diameter surface includes an outwardly projecting flange having a lower surface, and the bottom surface includes a plurality of channels.

Implementations of the invention may include one or more of the following features. The lower surface may be substantially parallel to the top surface and the bottom surface. The outer diameter surface may include a tapered section having a circumference that is greater toward the bottom surface than the top surface. The outer diameter surface may include a vertical section between the tapered section and the bottom surface. This tapered section may form an angle of about 60° relative to the bottom surface. The inner diameter surface may include a tapered section having a circumference that is greater toward the top surface than the bottom surface. The inner diameter surface may include a vertical section between the tapered section and the bottom surface. This tapered section forms an angle of about 80° relative to the top surface. The bottom surface may include channels. The top surface may include a plurality of holes, e.g., eighteen holes, formed therein. At least one drain hole may extend from the inner diameter surface to the outer diameter surface. The inner diameter surface may have a radius of about 300 mm adjacent the bottom surface.

In another aspect, the invention is directed to a retaining ring for a carrier head for use in chemical mechanical polishing having a mounting surface for a substrate. The retaining ring has a generally annular lower portion having a bottom surface for contacting a polishing pad, wherein the bottom surface includes a plurality of channels, and a generally annular upper portion secured to the lower portion, the upper portion having an outer diameter with an annular projection.

Implementations of the invention may include one or more of the following features. The annual projection may have a horizontal lower surface, a horizontal upper surface and a vertical cylindrical outer surface connecting the lower surface and the upper surface. The lower portion may have an inner diameter surface with a radius of about 300 millimeters. The outer diameter surface may include a tapered section wherein a circumference of the tapered section is greater toward the upper portion than the lower portion. The lower portion and the upper portion can be formed as a single unit.

In another aspect, the invention is directed to a retaining ring for use in chemical mechanical polishing having a mounting surface for a substrate. The retaining ring has an inner diameter surface with a tapered surface. A circumference of the inner diameter of the retaining ring is smaller toward a bottom surface than a top surface of the retaining ring.

Implementations of the invention may include one or more of the following features. The inner diameter surface may include a cylindrical vertical surface.

One potential advantage of the invention is that, as the carrier head is lowered to receive the substrate at the transfer station, the tapered wall of the outer diameter of the retaining ring can engage the inner surface of the load cup to guide the retaining ring into alignment with the substrate. This improves concentricity of the retaining ring and the substrate held by the transfer station and improves reliability of the loading process.

Another potential advantage of the invention is that the flat lower surface of the flange on the outer diameter of the retaining ring can engage and rest on the upper surface of the load cup. This improves parallelism between the carrier head and the substrate and improves reliability of the loading process. In addition, the flat lower surface of the flange will properly engage the upper surface of the load cup to ensure parallelism even if the bottom surface of the retaining ring has been worn.

BRIEF DESCRIPTION OF THE DRAWINGS

FIG. 1 is a perspective view, partially cross-sectional, of a retaining ring according to the present invention.

FIG. 2A is a bottom view of the retaining ring of FIG. 1.

FIG. 2B is a side view of the retaining ring of FIG. 1.

FIG. 3 is a perspective view of the retaining ring of FIG. 1.

FIG. 4 is a cross-sectional view of the retaining ring along line 4—4 in FIG. 3.

DETAILED DESCRIPTION

Referring to FIGS. 1, 3 and 4, a retaining ring 100 is a generally annular ring that can be secured to a carrier head of a CMP apparatus. A suitable CMP apparatus is described in U.S. Pat. No. 5,738,574 and a suitable carrier head is described in U.S. Pat. No. 6,251,215, the entire disclosures of which are incorporated herein by reference. The retaining ring 100 fits into a loadcup for positioning, centering, and holding the substrate at a transfer station of the CMP apparatus. A suitable loadcup is described in U.S. Pat. No. 6,716,086, entitled EDGE CONTACT LOAD CUP (EP Publication No. 1061558), and assigned to the assignee of the present invention, the entire disclosure of which is hereby incorporated.

The retaining ring 100 can be constructed from two pieces. The first piece, the lower portion 105, has a flat bottom surface 110 which includes eighteen channels 210 or grooves, shown in FIGS. 2A and 2B (there could be a different number of channels). The straight channels 210 begin at the inner circumference and end at the outer circumference of the bottom surface 110 and can be distributed at equal angular intervals around the retaining ring 100. The channels are typically oriented at 45° relative to a radial segment extending through the center of the retaining ring 100, but other angles of orientation, such as between 30° and 60°, are possible.

Referring again to FIGS. 1, 3 and 4, an inner diameter 115 of the lower portion 105 forms a straight vertical cylindrical surface. In contrast, the outer diameter surface 120 of the lower portion 105 includes both a vertical portion 125, starting adjacent the bottom surface 110, and an outwardly sloping portion 130 which extends upwardly from the vertical portion 125. The outwardly sloping portion 130 of the outer diameter may form an angle of about 60° relative to the bottom surface 110 of the retaining ring. A flat top surface 135 of the lower portion 105 is parallel with the bottom surface 110. This top surface 135 meets the sloped portion 130 of the outer diameter surface 120 at an obtuse angle and meets the inner diameter 115 at a substantially right angle. The inner diameter 115 defines a substrate receiving recess 140 of the retaining ring 100.

The lower portion 105 of the retaining ring 100 can be formed from a material that is chemically inert to the CMP process. The material should be sufficiently elastic that contact of the substrate edge against the retaining ring 100 does not cause the substrate to chip or crack. However, the retaining ring 100 should not be so elastic as to extrude into the substrate receiving recess 140 when the carrier head puts downward pressure on the retaining ring 100. The retaining ring 100 should also be durable and have a low wear rate, although it is acceptable for the retaining ring 100 to wear away. For example, the retaining ring 100 can be made of a plastic, such as polyphenylene sulfide (PPS), polyethylene terephthalate (PET), polyetheretherketone (PEEK), polybutylene terephthalate (PBT), polytetrafluoroethylene (PTFE), polybenzimidazole (PBI), polyetherimide (PEI), or a composite material.

The second piece of the retaining ring 100, the upper portion 145, has a flat bottom surface 150 and a top surface 160 that is parallel to the bottom surface 150. The top surface 160 includes eighteen holes 165 to receive bolts, screws, or other hardware for securing the retaining ring 100 and carrier head together (there could be a different number of holes). Additionally, one or more alignment apertures 170 can be located in the upper portion 145. If the retaining ring 100 has an alignment aperture 170, the carrier head can have a corresponding pin that mates with the alignment aperture 170 when the carrier head and retaining ring 100 are properly aligned.

The outer diameter surface 175 of the upper portion 145 includes an outwardly sloped section 190, a horizontal section 185, and a vertical section 180. The outwardly sloping section 190 of the outer diameter surface 175 may form an angle of about 60° relative to the bottom surface 110 of the retaining ring. The inner diameter surface 155 of the upper portion 145 is sloped outwardly so that the top of the inner surface diameter 155 has a greater diameter than the bottom. The outwardly sloping inner diameter surface 155 may form an angle of about 80° relative to the top surface 160 of the retaining ring. The top surface 160 meets the outer diameter surface 175 at a substantially right angle, whereas the bottom surface 150 meets the outer diameter surface 175 at an obtuse angle. The horizontal section 185 is parallel to the top and bottom surfaces 160 and 150, respectively. The top surface 160, vertical section 180, and horizontal section 185 of the upper portion 145 together form a flange 195.

The upper portion 145 of the retaining ring 100 can include one or more drain holes 200, e.g., four drain holes spaced at equal angular intervals around the retaining ring. These drain holes 200 extend through the retaining ring from the inner diameter surface 155 to the outer diameter surface 175, e.g., in the sloped section 190. The drain holes 200 can be tilted, e.g., higher at the inner diameter surface than at the outer diameter surface. Alternatively, the drain holes 200 can be substantially horizontal, or the retaining ring can be manufactured without drain holes.

The upper portion 145 can be formed from a rigid material, such as metal. Suitable metals for forming the upper portion include stainless steel, molybdenum, or aluminum. Alternatively, a ceramic can be used.

The lower portion 105 and the upper portion 145 are connected at their top 135 and bottom 150 surfaces, respectively, to form the retaining ring 100. When the upper portion 145 and lower portion 105 are aligned and mated, the retaining ring 100 has a unitary tapered surface 130, 190 at a constant angle along the outer diameter surface 120, 175. The two parts can be joined using an adhesive, screws, or a press-fit configuration. The adhesive layer can be a two-part slow-curing epoxy, such as Magnobond-6375™, available from Magnolia Plastics of Chamblee, Ga.

When the retaining ring 100 is secured to a base of a carrier head, the circumference of the top of the outer diameter 180 can be substantially the same as the circumference of the base of the carrier head so that no gap exists along the outer edge of the carrier head.

In normal operation of the CMP apparatus, a robotic arm moves a 300 mm substrate from cassette storage to a transfer station. At the transfer station, the substrate is centered in the loadcup. The carrier head moves into place above the loadcup. Once the carrier head and loadcup are generally aligned with one another, the carrier head is lowered into position to collect the substrate. Specifically, the carrier head is lowered so that the bottom of the retaining ring's outer diameter surface 120, 175 fits into the loadcup. To aid in centering the retaining ring 100, the narrowest portion of the retaining ring 100 enters the loadcup first. As the carrier head is lowered, the tapered edge 130, 190 engages the inner surface of the loadcup, and guides the retaining ring 100 into concentric alignment with the loadcup. This alignment in turn concentrically aligns the substrate and retaining ring 100 with one another (assuming the substrate has been properly centered in the loadcup).

As the carrier head is lowered further, the retaining ring's flange 195 engages and then rests upon a substantially horizontal portion of the loadcup. This flat annular surface and maintains a parallel disposition between the substrate in the loadcup and the retaining ring 100 and carrier head.

Once the substrate has been loaded into the carrier head, the carrier head lifts away to disengage from the loadcup. The carrier head can move from the transfer station to each of the polishing stations on the CMP apparatus. During CMP polishing, the carrier head applies pressure to the substrate and holds the substrate against the polishing pad. During the polishing sequence, the substrate is located within the receiving recess 140, which prevents the substrate from escaping. The channels 210 in the retaining ring 100 facilitate the transport of slurry to and from the substrate when the retaining ring 100 is in contact with the polishing pad. Once polishing is completed, the carrier head returns to a position over the loadcup and lowers so that the retaining ring 100 is brought into and re-engages the loadcup. The substrate is released from the carrier head, and subsequently moved to the next step of the polishing sequence.

The present invention has been described in terms of a number of embodiments. The invention, however, is not limited to the embodiments depicted and described. Rather, the scope of the invention is defined by the appended claims. For example, above the horizontal section 185, the outer diameter 180 of the retaining ring 100 can have a straight or sloped geometry. The inner diameter 155 can have a straight, sloped, or mixed straight and sloped geometry. The retaining ring 100 can be constructed from a single piece of plastic, using, for example, PPS, instead of being formed from separate upper 145 and lower portions 105.

What is claimed is:

1. A retaining ring comprising:
a generally annular body having a top surface, a bottom surface, an inner diameter surface, and an outer diameter surface, wherein the bottom surface is configured to contact a polishing pad during polishing and the outer diameter surface includes a vertical surface, a tapered section and an outwardly projecting flange having a lower surface parallel to the top surface of the annular body, the vertical surface is adjacent to the bottom surface and the tapered section extends upwardly and outwardly from the vertical surface to the lower surface of the flange.

2. The retaining ring of claim 1, wherein the tapered section forms an angle of about 60° relative to a plane parallel to the bottom surface.

3. The retaining ring of claim 1, wherein the inner diameter surface includes a tapered section having a circumference that is greater toward the top surface than toward the bottom surface.

4. The retaining ring of claim 3, wherein the inner diameter surface includes a vertical section between the tapered section and the bottom surface.

5. The retaining ring of claim 3, wherein the tapered section of the inner diameter surface forms an angle of about 80° relative to the top surface.

6. The retaining ring of claim 1, wherein the bottom surface includes a plurality of channels.

7. The retaining ring of claim 1, wherein the top surface includes a plurality of holes formed therein.

8. The retaining ring of claim 7, wherein the top surface includes eighteen holes.

9. The retaining ring of claim 1, further comprising at least one drain hale extending from the inner diameter surface to the outer diameter surface.

10. The retaining ring of claim 1, wherein the inner diameter surface has a radius of about 300 mm adjacent the bottom surface.

11. The retaining ring of claim 1, wherein the greatest circumference of the retaining ring is at the flange.

* * * * *